United States Patent [19]

Van Vonno et al.

[11] Patent Number: 4,594,265

[45] Date of Patent: Jun. 10, 1986

[54] LASER TRIMMING OF RESISTORS OVER DIELECTRICALLY ISOLATED ISLANDS

[75] Inventors: Nicolaas W. Van Vonno; Richard Hull, both of Melbourne; Paul S. Reinecke, Indialantic, all of Fla.

[73] Assignee: Harris Corporation, Melbourne, Fla.

[21] Appl. No.: 610,583

[22] Filed: May 15, 1984

[51] Int. Cl.$^4$ ................................................ B05D 3/06
[52] U.S. Cl. .......................... 427/53.1; 219/121 LJ; 427/102; 427/259; 427/264; 427/265; 427/276; 427/309; 427/344
[58] Field of Search ................. 427/38, 102, 264, 265, 427/276, 309, 344; 219/121 LJ; 347/49

[56] References Cited

U.S. PATENT DOCUMENTS

| | | | |
|---|---|---|---|
| 3,947,801 | 3/1976 | Bube | 338/308 |
| 4,081,653 | 3/1978 | Koo et al. | 219/121 LM |
| 4,179,310 | 12/1979 | Compton et al. | 148/1.5 |
| 4,190,854 | 2/1980 | Redfern | 357/51 |
| 4,272,775 | 6/1981 | Compton et al. | 357/29 |
| 4,468,414 | 8/1984 | Van Vonno | 427/53.1 |

Primary Examiner—Bernard D. Pianalto
Attorney, Agent, or Firm—Barnes & Thornburg

[57] ABSTRACT

Single crystal dielectrically isolated islands are formed providing a substantially non-reflective or indentured silicon surface before the application of the dielectric isolation layer and the polycrystalline support. Thin film resistor material is formed and delineated on an insulative layer over the single crystal island juxtaposed to the substantially non-reflective bottom dielectric isolation. The thin film resistive layer is trimmed using a laser.

36 Claims, 15 Drawing Figures

LASER TRIMMING OF RESISTORS OVER DIELECTRICALLY ISOLATED ISLANDS

BACKGROUND AND SUMMARY OF THE INVENTION

The present invention relates generally to laser trimming and more specifically to laser trimming above a dielectrically isolated single crystal region.

Laser trimming of thin-film resistors is used extensively to produce improved accuracy in analog integrated circuit technology. In integrating laser trimming into dielectrically isolated circuit technology, a difficulty peculiar to dielectric isolation has been identified. Trimming is generally accomplished by use of an infrared laser for improved control. Silicon is nearly transparent at the wavelengths used; this results in laser energy penetrating to the bottom of the dielectrically isolated island, reflecting back and transferring some of the reflected energy back to the resistor. The result is poor control due to interference effects. These effects are variable due to changes in dielectrically isolated island depth and proper control over trim energy hence becomes very difficult.

An existing technique addresses the problem by simply placing the thin-film resistor over the polycrystalline silicon used to support the dielectrically isolation regions. The polysilicon is much thicker than the single-crystal islands (typically 10 mils vs. 1 mil) and energy scattering off the grain boundaries soon dissipates the laser beam. The resulting lack of reflection and interference produces enhanced controllability. The resistor is deposited over a polycrystalline surface which is not perfectly flat but in fact possesses considerable relief at the grain boundaries. In addition, large polycrystalline areas tend to "dish out" during the grind and polish operation which complicates laser focusing and reduces photoresist definition, resulting in poor control over resistor geometries.

One solution is suggested in corresponding U.S. patent application Ser. No. 518,725 filed July 29, 1983 now U.S. Pat. No. 4,468,414 N. W. Van Vonno. An opening is provided in the dielectric isolation at the bottom of the single crystal island exposing the polycrystalline support. Thus, infrared radiation passes into the support and does not reflect back to the top surface of the single crystal island. In some applications, all islands must be dielectrically isolated.

An object of the present invention is to provide a method of fabricating laser trimmed thin film resistors over single crystal islands.

Another object of the present invention is to provide a method of laser trimming thin film resistors on dielectrically isolated integrated circuits.

Still another object of the present invention is to provide a method for fabricating dielectrically isolated islands with non-reflective bottom surfaces to be used with subsequent laser trimming steps.

A further object of the present invention is to provide an integrated circuit having laser trimmed thin film resistors on dielectrically isolated integrated circuits.

An even further object of the present invention is to provide a totally dielectrically isolated integrated circuit having improved laser trimmed thin film resistors thereon.

These and other objects of the invention are attained by fabricating dielectrically isolated islands with a substantially non-reflecting or poorly reflecting bottom. The thin film resistors are formed over an insulative surface on the single crystal surface and are subsequently laser trimmed. The bottom of the dielectrically isolated island including a polycrystalline support structure may be rendered non-reflective by forming a plurality of indentures in the bottom of the island prior to the growth of the insulating oxide. The indentures may be formed by etching a parallel pattern of shallow V-shaped grooves. Alternatively, the surface may be rendered non-reflective by etching with an appropriate etchant to produce a rough surface on the bottom of the island. Yet another method involves rendering the island bottom non-reflective by mechanically damaging or abrading the silicon surface by such well-known means as sandblasting and mechanical abrasion. All of the above alternative methods are followed by growing of the dielectric isolation layer over the bottom of the substrate and face of the moats, applying the polycrystalline support structure and removing most of the original substrate to form the dielectrically isolated regions. The non-reflective, indentured regions may be a portion of the total dielectric isolation layer and the thin film resistive material is applied and delineated on the top of the dielectrically isolated region to form a resistor juxtaposed to the nonreflective bottom dielectric isolation. This is followed by laser trimming using a laser of suitable wavelength and power level.

Other objects, advantages and novel features of the present invention will become apparent from the following detailed description of the invention when considered in conjunction with the accompanying drawings.

DETAILED DESCRIPTION OF THE DRAWINGS

Figure 1:
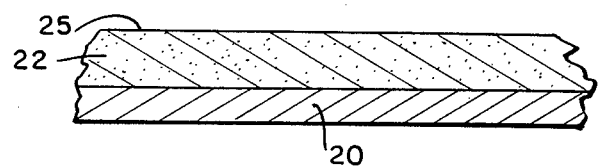
FIGS. 1 through 7 are cross-sectional views illustrating the different stages of fabricating a laser trimmed thin film resistor on dielectrically isolated single crystal islands according to the principles of the present invention.
Figure 2:
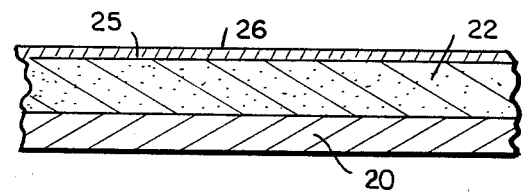

The method of fabricating laser trimmed thin film resistors on dielectrically islated single crystal islands begins as illustrated in FIG. 1 by epitaxially growing a single crystal layer 22 on a single crystal substrate 20. Substrate 20 has a substantially higher impurity concentration and lower resistance than the epitaxial layer 22. The exposed surface 25 of the epitaxial layer 22 is then subjected to an oxidizing atmosphere which forms an oxide masking layer 26 across surface 25. The structure at this stage is illustrated in FIG. 2. Alternatively, the structure 20, 22 can be formed as a single crystal substrate of the desired resistivity. The processing steps to follow will apply to both situations.

Figure 3:
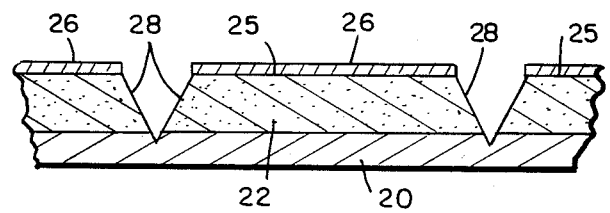
Figure 4:
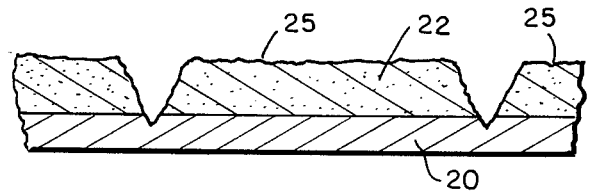

The mask layer 26 is delineated by standard photolithographic processes to form openings therein. The epitaxial layer 22 and the substrate 20 are then etched to form the V-shaped moats 28 as illustrated in FIG. 3. The oxide mask layer 26 is then removed and the exposed surface of the moats 28 as well as the exposed surface 25 are then etched using either wet chemical or plasma etching techniques to render the surface substantially non-reflective by forming a plurality of indentures. The indentures should have a minimum depth of 4000 Angstroms so as to present a non-planar surface from which laser radiation may reflect. With the angle of the indentures, the laser waves are deflected and ricochet about the bottom and sides of the single crystal island losing energy such that any wave which finally reaches the top surface will have little if any effect. As is well known, the reflection and deflection of the waves is produced by the dielectric isolated layer to be formed along the surface 25 and in the moats 28. To produce the desired random indentures, an etchant, for example, an aqueous solution of potassium hydroxide may be used with a silicon substrate at a temperature in the range of 20° C. to 30° C. Alternatively, plasma etching or reactive ion etching using commercially available gas mixtures designed for silicon etching can be used. The resulting structure is illustrated in FIG. 4.

Figure 5:
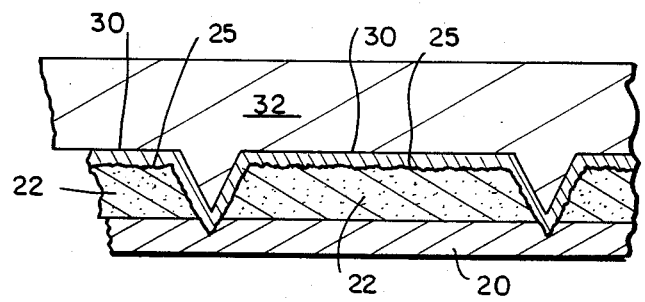
Figure 6:
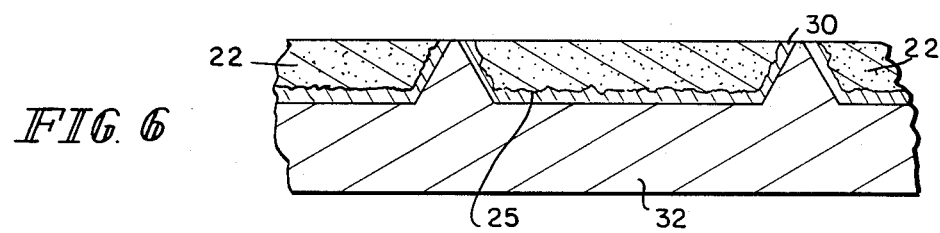

The structure as shown is then exposed to an oxidizing atmosphere such that the dielectric isolation region 30 is formed thereon. A polycrystalline material 32 is then deposited over the dielectric isolation layer 30 as illustrated in FIG. 5. The substrate 20 is removed by well-known methods which may include grinding or wet etching in combination with grinding down to the bottom of the moat regions 28 to expose the tip of the dielectric isolation layer 30 to define a plurality of dielectrically isolated single crystal regions of the original epitaxial layer 22 as illustrated in FIG. 6.

Figure 7:
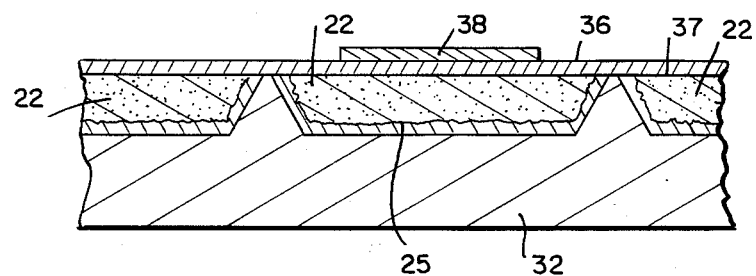

An insulation layer 36 for example, silicon dioxide, is formed on the top surface 37 of the single crystal regions. A thin film resistor material 38 for example nickel-chromium alloy is then applied on the insulative layer 36 and delineated to form substantially the geometry of the thin film resistors as illustrated in FIG. 7. The final geometry and characteristic of the thin film resistor is defined by laser trimming the layer 38. Preferably, the laser is an infrared laser. Since the silicon is nearly transparent at infrared wavelengths, the laser energy penetrates through the single crystalline region 22. Little if any of the laser radiation is reflected back affecting the thin film resistor 38. The well-defined and flat surface of the single crystal region does not result in dishing out or other problems associated with large polycrystalline silicon areas between the single crystal islands.

Figure 8:
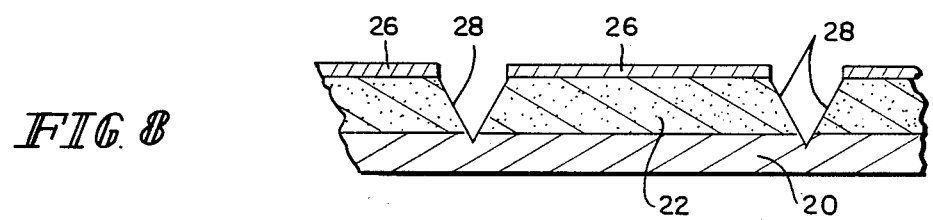
FIGS. 8 through 11 are cross-sectional views illustrating a modification of the process of FIGS. 1 through 7.
Figure 9:
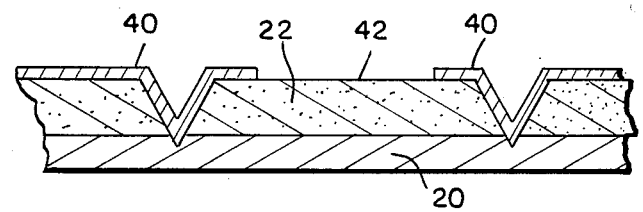
Figure 10:
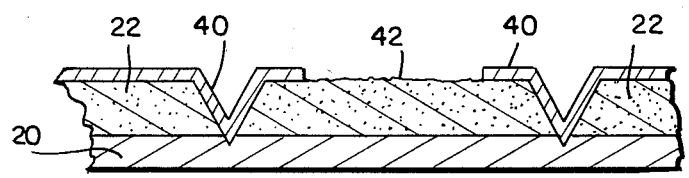
Figure 11:
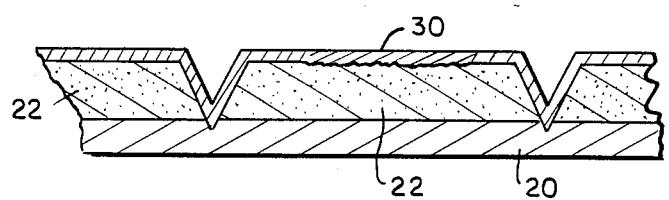

An alternative method for forming the non-reflective surface at the bottom of the single crystal region 22 is illustrated in FIGS. 8 through 11. In this embodiment, the chemical etch of the dielectrically isolated islands is confined to certain islands by selective etching of the lower face of these islands. As in the previous method, the moat regions 28 are formed in the epitaxial layer 22 and the substrate 20 using the moat mask 26 as illustrated in FIG. 8. A mask layer 40 is then formed on the substrate 20 and an opening 42 is provided therein as illustrated in FIG. 9. The silicon exposed by this masking step is then etched using either wet chemical or plasma etching techniques as illustrated in FIG. 10. The mask layer 40 is then removed and the wafer is subjected to an oxidizing atmosphere to form the dielectric isolation region 30 over the walls of the moats and the island bottoms as illustrated in FIG. 11.

Since the non-reflective or indentured portion 42 does not cover the total bottom surface of the single crystal island, the delineation of the resistive material of thin film resistor 38 must be juxtaposed to the substantially non-reflective portion 42.

In an alternative method, the bottom surface only of the single crystal island may be made substantially non-reflective by forming the indentures on surface 25 before forming the moats 28. This is followed by subsequently forming the mask layer 26 and the moats 28. Although this method is possible, it is not preferred since the oxide masking layer 26 must be grown; therefore, the indentured portions would be subjected to oxide growth which may adversely affect the indentures.

Figure 12:
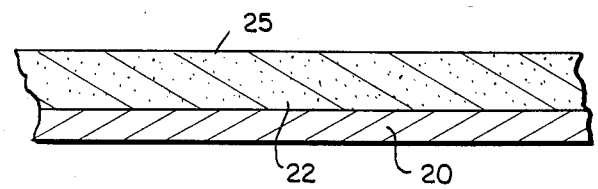
FIGS. 12 through 15 are cross-sectional views illustrating a further modification of the process of FIGS. 8 through 11.
Figure 13:
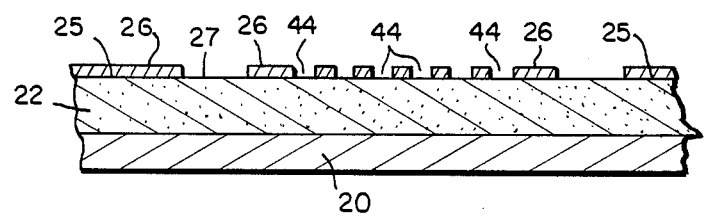
Figure 14:
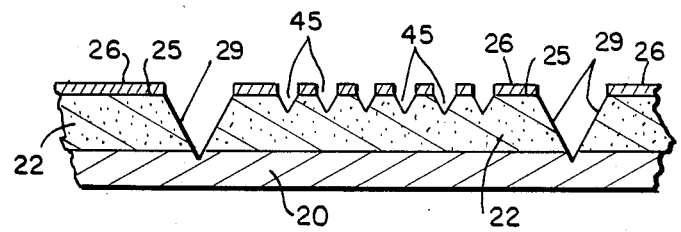

A third method begins with an epitaxial growth sequence as illustrated in FIG. 12. The exposed surface 25 of the expitaxial layer 22 is then subjected to an oxidizing atmosphere which forms an oxide masking layer 26 across surface 25. The mask layer 26 is then delineated by standard photolithographic processes as shown in FIG. 13 to form openings 27 and 44 therein. The openings 27 are of sufficient width to enable deep isolation moats 29 to be etched. The openings 44 are narrower than the openings 27 and result in shallower moats 45 following etching of the epitaxial layer 22 and the substrate 20, as shown in FIG. 14. Thus, a single indenture is formed in each opening 44. The oxide masking layer 26 is then removed and the wafer is then subjected to an oxidizing atmosphere to form the dielectric isolation region 30 over the walls of the moats 29 and the shallower grooves 45. The final structure including the thin film resistor 38 and reflectively reducing peaks 46 fabricated as stated above is shown in FIG. 15.

A fourth method uses the non-selective etching procedure as outlined above for FIG. 4 and replaces the etching by mechanical damage or abrasion by, for example, sandblasting.

A fifth method uses the selective etching procedure as outlined for FIG. 9 and replaces the etching by selective mechanical damage or abrasion.

Figure 15:
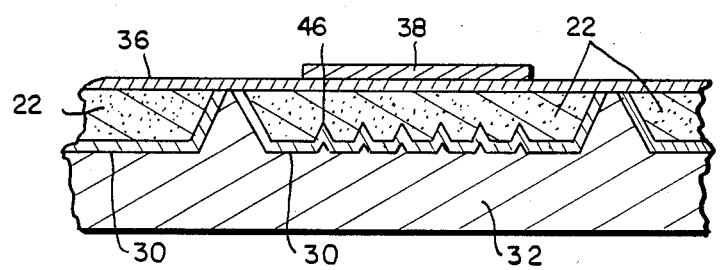

In any of the selective non-reflective inserts, for example, FIGS. 11 and 15 and the mechanical damaging embodiments, the delineated thin film resistor before laser radiation must be juxtaposed to the selective area in order to accomplish the benefits of the present invention.

From the preceding description of the preferred embodiments, it is evident that the objects of the present invention are attained, and although the invention has been described and illustrated in detail, it is to be clearly understood that the same is by way of illustration and example only and is not to be taken as a limitation. The spirit and scope of the present invention are to be limited only by the terms of the appended claims.

What is claimed is:

1. A method of fabricating dielectrically isolated islands for subsequent use with laser radiation processing comprising:
forming isolation grooves in a first surface of a semiconductor substrate;
forming a plurality of indentures in said first surface;
forming a layer of dielectric material on said first surface, in said indentures and on said grooves;
forming a layer of support material on said dielectric layer overfilling said grooves;
removing portions of said substrate to a second surface opposite said first surface to form dielectrically isolated islands of said substrate exposed at said second surface.

2. The method according to claim 1 wherein said indentures are formed non-selectively in said first surface and in said grooves.

3. The method according to claim 1 including forming a mask on said first surface having openings exposing portions of said first surface and forming said plurality of indentures in said exposed portions of said first surface.

4. The method according to claim 1 wherein forming said grooves includes forming a mask on said first surface having openings exposing portions of said first surface, and etching grooves in the exposed portion of said first surface.

5. The method according to claim 1 wherein said indentures are formed to have a minimum depth of 4000 Angstroms.

6. The method according to claim 1 wherein forming said indentures includes etching said first surface to form said plurality of indentures.

7. A method according to claim 6 wherein forming said indentures includes forming a mask on said first surface having openings exposing portions of said first surfaces and etching an indenture in each of said openings.

8. A method according to claim 6 wherein said etching includes chemical etching.

9. A method according to claim 6 wherein said etching includes plasma etching.

10. A method according to claim 6 wherein said etching includes reactive ion etching.

11. A method according to claim 1 wherein forming said indentures includes abrading said first surface to form said plurality of indentures.

12. A method according to claim 11 wherein said abrading includes sandblasting.

13. A method of fabricating dielectrically isolated islands for subsequent use with laser radiation processing comprising:
   treating a first surface of a single crystal semiconductor substrate to substantially reduce the reflectivity of subsequently applied dielectric material;
   forming isolation grooves in said first surface of said substrate;
   forming a layer of dielectric material on said first surface and on said grooves;
   forming a layer of support material on said dielectric layer overfilling said grooves;
   removing portions of said substrate to a second surface opposite said first surface to form dielectrically isolated islands of said substrate exposed at said second surface.

14. A method according to claim 13 wherein treating said first surface includes forming a mask on said first surface having openings exposing portions of said first surface and forming a plurality of indentures in said exposed portions of said first surface.

15. A method according to claim 14 wherein said indentures are formed to have a minimum depth of 4000 Angstroms.

16. A method according to claim 13 wherein treating said first surface includes etching said first surface to form a plurality of indentures.

17. A method according to claim 16 wherein forming said indentures includes forming a mask on said first surface having openings exposing portions of said first surfaces and etching an indenture in each of said openings.

18. A method according to claim 13 wherein treating said first surface includes abrading said first surface to form a plurality of indentures.

19. A method of laser trimming comprising:
   forming an element of laser trimmable material on a single crystal semiconductor island having dielectric isolation along its bottom juxtaposed indentations in said dielectric isolation; and
   subjecting said element to laser radiation to remove portions of said laser trimmable material.

20. The method according to claim 19 wherein said semiconductor is silicon and said laser radiation is infrared.

21. A method of laser trimming comprising:
   forming an element of laser trimmable material on a single crystal semiconductor island having dielectric isolation along its bottom juxtaposed a substantially non-reflective portion of said dielectric isolation; and
   subjecting said element to laser radiation to remove portions of said laser trimmable material.

22. The method according to claim 21 wherein said semiconductor is silicon and said laser radiation is infrared.

23. A method of fabricating a thin film resistor in an integrated circuit comprising:
   forming a plurality of indentures in a first surface of a semiconductor substrate;
   dividing said substrate into a plurality of dielectrically isolated islands having said first surface adjacent the dielectric isolation;
   forming a thin film resistor of laser trimmable material at a second surface of said substrate above said indentures in said substrate; and
   subjecting said resistor to laser radiation to remove portions of said laser trimmable material.

24. A method according to claim 23 wherein forming said indentures includes etching said first surface to form said indentures.

25. A method according to claim 23 wherein forming said indentures includes abrading said first surface to form said indentures.

26. A method according to claim 23 wherein said indentures are formed non-selectively in said first surface.

27. A method according to claim 23 including forming a mask on said first surface having openings exposing portions of said first surface and forming said plurality of indentures in said exposed portions of said first surface.

28. A method according to claim 23 wherein said indentures are formed to have a minimum depth of 4000 Angstroms.

29. A method of fabricating a thin film resistor in an integrated circuit comprising:
   treating a first surface of a single crystal semiconductor substrate to substantially reduce the reflectivity of subsequently applied dielectric material;
   dividing said substrate into a plurality of dielectrically isolated islands having said first surface adjacent the dielectric isolation;
   forming a thin film resistor of laser trimmable material at a second surface of said substrate above said treated surface of said substrate; and
   subjecting said resistor to a laser radiation to remove portions of said laser trimmable material.

30. A method according to claim 29 wherein treating said first surface includes forming a mask on said first surface having openings exposing portions of said first surface and forming a plurality of indentures in said exposed portions of said first surface.

31. A method according to claim 30 wherein said indentures are formed to have a minimum depth of 4000 Angstroms.

32. A method according to claim 29 wherein treating said first surface includes etching said first surface to form a plurality of indentures.

33. A method according to claim 32 wherein forming said indentures includes forming a mask on said first surface having openings exposing portions of said first surfaces and etching an indenture in each of said openings.

34. A method according to claim 30 wherein treating said first surface includes abrading said first surface to form a plurality of indentures.

35. A method of fabricating a thin-film resistor comprising:

forming a plurality of dielectrically isolated single crystal semiconductor islands in a support with at least a portion of the dielectric isolation at the bottom of said island being substantially non-reflective;

forming an isolation layer on the top surface of said islands;

forming a thin film resistor on said isolation layer juxtaposed said non-reflective portion of said dielectric isolation; and subjecting said thin film resistor to laser radiation to remove portions of said resistor.

36. A method of fabricating a thin-film resistor comprising:

forming a plurality of dielectrically isolated single crystal semiconductor islands in a support with at least a portion of the dielectric isolation at the bottom of said island having a plurality of indentures;

forming an isolation layer on the top surface of said islands;

forming a thin film resistor on said isolation layer juxtaposed said indentured portion of said dielectric isolation; and subjecting said thin film resistor to laser radiation to remove portions of said resistor.

* * * * *